United States Patent
Sato et al.

(10) Patent No.: US 6,174,222 B1
(45) Date of Patent: Jan. 16, 2001

(54) PROCESS FOR FABRICATION OF SEMICONDUCTOR DEVICE, SEMICONDUCTOR WAFER FOR USE IN THE PROCESS AND PROCESS FOR THE PREPARATION OF THE WAFER

(75) Inventors: Tomomi Sato; Norio Suzuki, both of Tokyo; Hirofumi Shimizu, Nakakoma-gun; Atsuyoshi Koike; Hisashi Maejima, both of Tokyo; Akira Kanai, Takasaki, all of (JP)

(73) Assignees: Hitachi, Ltd.; Hitachi ULSI Engineering Corp., both of Tokyo (JP)

( * ) Notice: Under 35 U.S.C. 154(b), the term of this patent shall be extended for 0 days.

(21) Appl. No.: 08/654,832

(22) Filed: May 28, 1996

(30) Foreign Application Priority Data

Jun. 9, 1995 (JP) .................................................. 7-168190

(51) Int. Cl.$^7$ ............................................................ B24B 9/06
(52) U.S. Cl. ............................................. 451/44; 427/249
(58) Field of Search ................................. 451/44, 43, 246, 451/254, 258; 427/249, 229

(56) References Cited

U.S. PATENT DOCUMENTS

| | | | |
|---|---|---|---|
| 4,984,392 | * | 1/1991 | Sekigawa et al. ...................... 451/11 |
| 5,289,661 | * | 3/1994 | Jones et al. ............................. 451/44 |
| 5,490,811 | * | 2/1996 | Hosokawa ............................ 451/239 |

FOREIGN PATENT DOCUMENTS

| | | | | |
|---|---|---|---|---|
| 2107979 | * | 5/1987 | (JP) | ..................................... 451/177 |
| 64-48020 | | 3/1989 | (JP) | . |
| 2-180554 | * | 7/1990 | (JP) | ..................................... 451/540 |
| 2-106821 | | 8/1990 | (JP) | . |
| 2-240912 | | 9/1990 | (JP) | . |

* cited by examiner

Primary Examiner—Robert A. Rose
(74) Attorney, Agent, or Firm—Nattingly, Stanger & Malur, P.C.

(57) ABSTRACT

In a process for the fabrication of a semiconductor integrated circuit using a double-side mirror-polished wafer or the like, at the portion of a notch 10 of a notched wafer 1, a chamfered angle $\theta_{11}$ of the first chamfered portion 11 formed at the inner periphery of the first primary surface 3 is set smaller than the chamfered angle $\theta_{12}$ of the second notch chamfered portion 12 of the second primary surface 4 and the chamfered width $L_{11}$ is set larger than the chamfered width $L_{12}$, whereby the obverse and reverse of the wafer are discriminated by optically discriminating the first notch chamfered portion and the second notch chamfered portion using reflected light, thereby making it certain to fabricate IC on the surface of the wafer and to use the reverse for its handling. The plane view of the notch in the circumferential direction can be maintained symmetrical so that the lowering in the symmetry of the wafer and the number of the IC available from the wafer can be prevented and the standards of the notch can be maintained.

8 Claims, 10 Drawing Sheets

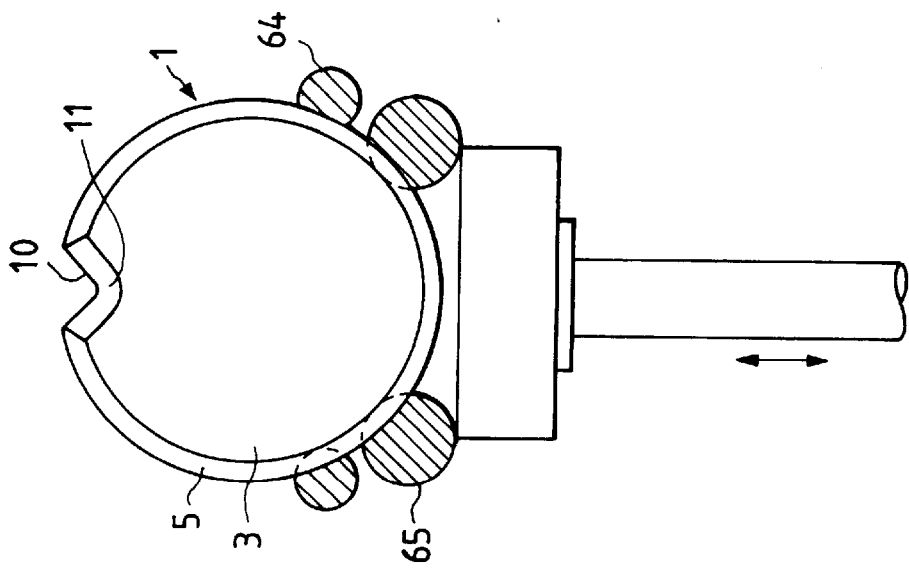
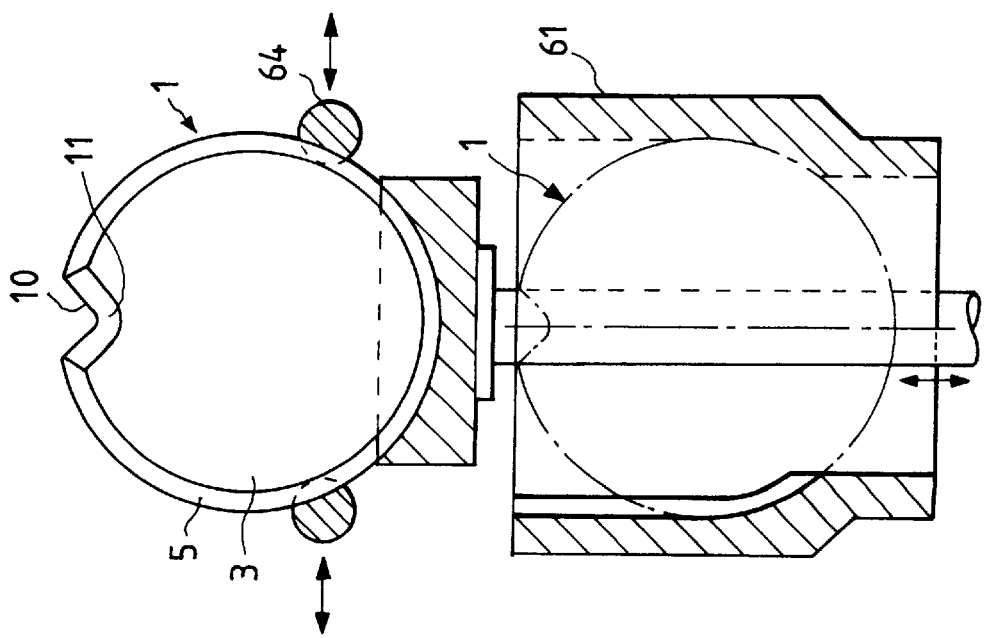

INSERTING DIRECTION

PROCESS FOR FABRICATION OF SEMICONDUCTOR DEVICE, SEMICONDUCTOR WAFER FOR USE IN THE PROCESS AND PROCESS FOR THE PREPARATION OF THE WAFER

BACKGROUND OF THE INVENTION

The present invention relates to a fabrication technique of a semiconductor device, particularly to a semiconductor wafer (hereinafter called "wafer") for use in a so-called pre-step among fabrication steps of the semiconductor device. More specifically, the present invention relates to a technique useful for the fabrication of a semiconductor integrated circuit device (hereinafter abbreviated as "IC").

In general, IC is obtained by forming an integrated circuit including a semiconductor device (said integrated circuit including a semiconductor device will hereinafter be called "integrated circuit") for each of a number of pellet divisions on the side of a primary surface of a wafer, separating the wafer into each pellet and then fabricating. In such a fabrication process of IC, it is necessary to finish the primary surface, on which an integrated circuit is to be made, as a mirror surface. In the case when only one of a pair of the primary surfaces is mirror-finished, it is easy to make discrimination between the obverse and reverse of the wafer. When the both sides of the wafer are mirror-finished, however, it becomes difficult to make discrimination between the observe and reverse of the wafer. Techniques have therefore been proposed in which an orientation flat (hereinafter abbreviated as "orifla") for indication of the direction of a crystal axis is formed asymmetrically in a circumferential direction or in which a second orifla is formed for the discrimination between the obverse and reverse of a wafer.

An example describing a wafer whose observe and reverse can be discriminated without changing its circular shape is disclosed in Japanese Patent Utility Model No. 106821/1990. Described specifically, disclosed in it is a technique in which the obverse and reverse of the wafer are discriminated by the difference between the sizes of two chamfered corners defined by the obverse and the side surface of the wafer and the reverse and the side surface of the wafer.

As a wafer which can suppress the lowering of the rotation symmetry and in addition, increase the number of the semiconductor pellets (hereinafter called "pellets"), a wafer having a notch formed at the circumferential portion thereof (said wafer will hereinafter be called "notched wafer") is known.

A notched wafer is disclosed, for example, in Japanese Utility Model Laid-Open No. 48020/1989. In it, a wafer in which the upper and lower edges of its ridgeline defining a notch have chamfered is disclosed. This notched wafer has a chamfered part formed at the notch so that the notch can be prevented from the damage upon application of a locating pin thereto in the IC fabrication step. As a result, the fabrication yield can be heightened.

In Japanese Patent Laid Open No. 240912/1990, disclosed is a notched wafer in which a notch formed at the circumferential portion thereof takes a form changing unsuccessively with the positional change toward the central direction and its plane shape is formed bilaterally asymmetrical in the circumferential direction. According to this notched wafer, the notch is formed bilaterally asymmetrical in the circumferential direction so that it is possible to discriminate the primary surface of the obverse from the primary surface of the reverse.

SUMMARY OF THE INVENTION

In a notched wafer, it becomes necessary to discriminate the obverse from the reverse, because an integrated circuit is fabricated on one side of a primary surface. And, it becomes extremely difficult to discriminate the observe from the reverse of the notched wafer if both sides have been mirror polished. For example, if the obverse and the reverse of the notched wafer are mistaken upon application of the wafer to a pre-fabrication step for IC, there is a danger of an integrated circuit being formed on a primary surface (reverse) of the notched wafer contaminated during handling or the like before application to the pre-fabrication step.

An object of the present invention is therefore to provide a notched wafer whose obverse and reverse can be discriminated and to provide a process for the fabrication of a semiconductor device capable of properly fabricating a semiconductor device by discriminating the obverse from the reverse of the notched wafer.

As disclosed in the above-described Japanese Patent Laid-Open No. 240912/1990, according to the notched wafer in which the plane shape of the notch is formed bilaterally asymmetrical in the circumferential direction, the primary surface on the obverse of the wafer can be discriminated from the primary surface on the reverse side of the wafer. The asymmetrical plane shape of the notch, however, causes damage to the rotation symmetry of the wafer, decreases the number of the pellets to be formed and besides, makes the notch in a special form outside the standards. It is therefore accompanied with the problem that a drastic reform becomes necessary in a positioning mechanism using a notch in a fabrication device used for the fabrication process of IC.

An object of the present invention is to provide a notched wafer permitting a discrimination between the obverse and reverse of the wafer while maintaining the symmetry of the plane shape of the notch.

Another object of the present invention is to provide a process for the fabrication of a semiconductor wafer by which said notched wafer can be fabricated rationally.

The above-described and other objects and novel characteristics of the present invention will be apparent from the description of this specification and drawings attached thereto.

Out of the aspects of the present invention disclosed in this application, representative ones can be summarized as follows:

The semiconductor wafer has a notch formed at the circumferential portion thereof and the notch comprises a chamfered portion formed at an inner periphery on one primary surface of the notch and a chamfered portion formed at an inner periphery on another primary surface, said chamfered portions being different each other.

According to the above-described means, the obverse and reverse of the semiconductor wafer can be discriminated by recognizing the difference between these chamfered portions. By distinguishing between the obverse and reverse of the semiconductor wafer, a principal surface on which a semiconductor device is to be fabricated can always be identified so that the semiconductor device can be fabricated properly by making use of such a structure of the semiconductor wafer.

There exists difference only in the chamfered portion and a plane shape of the notch can be maintained symmetrical in a circumferential direction. It is therefore possible to prevent a drastic deterioration in the symmetry of the semiconductor wafer and in the number of semiconductor device to be formed. In addition, by maintaining the standards for a notch, it is possible to avoid reforming of a notch-using positioning means of the existing fabrication system used for the fabrication of semiconductor devices.

Other aspects of the present invention disclosed in this application can be summarized briefly as follows:

1. A process for the fabrication of a semiconductor integrated circuit device comprising the following steps:

(a) a step of preparing plural silicon wafers of a substantially same shape for the fabrication of an integrated circuit, said silicon wafers each having an almost round and plane shape except the notched portion and having a mirror-polished first principal surface and second principal surface which are substantially parallel each other; and (b) by judging the obverse and reverse of each of said plural wafers from the notched portion which has been formed at the peripheral portion corresponding to a predetermined crystal orientation of the wafer and has been chamfered to be plane asymmetrical to a reference plane, assuming that a plane parallel to and is equally distant from said first and said second principal surfaces is the reference plane, a step of performing by single wafer processing or batch processing at least one procedure out of wafer processing procedures for the formation of an integrated circuit with said first principal surface as a surface on which the wafer is to be formed.

2. A process for the fabrication of a semiconductor integrated circuit device according to item 1, wherein the circumferential portion except the notched portion has been chamfered to be substantially plane symmetrical relative to said reference plane.

3. A process for the fabrication of a semiconductor integrated circuit device according to item 2, wherein said second principal surface is used for handling after polishing, specifically, used as a surface to be adsorbed,by a vacuum pincette or a surface used for mounting on a device.

4. A process for the fabrication of a semiconductor integrated circuit device according to item 3, wherein the plane shape of said notched portion is substantially bilaterally symmetrical.

5. A process for the fabrication of a semiconductor integrated circuit device according to item 4, wherein in the step (b), the notches and principal surfaces of said plural wafers are aligned in predetermined directions of a wafer treatment system, respectively.

6. A process for the fabrication of a semiconductor integrated circuit device according to item 3, wherein in the step (b), the notches and principal surfaces of said plural wafers are aligned in predetermined directions of a wafer treatment system, respectively.

7. A silicon wafer for use in the fabrication of an integrated circuit and having a substantially round plane shape except a notched portion, wherein a notch formed in the circumferential portion of the wafer has a chamfered portion formed on an inner periphery of a first principal surface and a chamfered portion formed on an inner periphery of a second principal surface, said chamfered portions being different in a shape each other.

8. A silicon wafer according to item 7, wherein said chamfered portion formed on the inner periphery of the first principal surface is at least partially equipped with a flat plane inclined at a predetermined angle relative to the principal surface.

9. A silicon wafer according to item 7, wherein a circumferential chamfered portion is formed uniformly over the circumferential portion of the wafer, and a circumferential chamfered portion formed at an outer periphery of the first principal surface and a circumferential chamfered portion formed at an outer periphery of the second principal surface are formed substantially identical in the shape.

10. A silicon wafer according to item 9, wherein both of said principal surfaces have been mirror-finished.

11. A silicon wafer according to item 7, wherein both of said principal surfaces have been mirror-finished.

12. A silicon [semiconductor] wafer according to item 10, wherein a surface orientation is formed as off-orientation, in other words, a plane orientation of the surface is shifted by a very small angle relative to a predetermined plane orientation.

13. A silicon wafer according to item 11, wherein a surface orientation is formed as on-orientation, in other words, a plane orientation of the surface coincides with a predetermined plane orientation with substantial accuracy.

14. A silicon wafer according to item 11, wherein a surface orientation is formed in off-orientation, in other words, a plane orientation of the surface is shifted by a very small angle relative to a predetermined plane orientation.

15. A process for the fabrication of a semiconductor integrated circuit device, which comprises the following steps:

(a) to a notched portion of a silicon wafer which wafer is used for the fabrication of an integrated circuit and has a substantially round plane shape except a notched portion formed over a circumferential portion thereof, a notch chamfering step to provide said notched portion with a chamfering treatment in the obverse-reverse asymmetrical form;

(b) a double side mirror polishing step, subsequent to the step (a), to provide both the principal surfaces on the obverse and reverse of said wafer with a mirror polishing treatment; and (c) an integrated circuit fabrication step, subsequent to the step (b), to conduct at least one step out of wafer processing steps for the formation of the integrated circuit using the primary surface on the obverse as a surface on which an integrated circuit is to be formed by single wafer processing or batch processing by distinguishing between the obverse and reverse of a large number of wafers, which have substantially the same shape and same size and have been subjected to the above treatments, from the notched portions thereof.

16. A process for the fabrication of a semiconductor integrated circuit device according to item 15, wherein the circumferential portions except the notched portions have been chamfered to substantially obverse-reverse symmetrical.

17. A process for the fabrication of a semiconductor integrated circuit device according to item 16, wherein the principal surface on the reverse of said wafer is used for handling in the above steps (b) and (c), specifically, used as a surface to be adsorbed by a vacuum pincette or a surface used for mounting on a device.

18. A process for the fabrication of a semiconductor integrated circuit device according to item 17, the plane shape of the notched portion is substantially bilaterally symmetrical.

19. A process for the fabrication of a semiconductor integrated circuit device, which comprises the following steps:

(a) a step of preparing a number of semiconductor wafers for the fabrication of an integrated circuit, each of said wafers having a first and a second primary surfaces which are substantially parallel each other, and having a round shape substantially free of an orientation flat and a notch; and (b) a step of performing plural wafer processing steps for the fabrication of said integrated circuit by single wafer processing or batch processing to align a predetermined orientation, out of plural predetermined crystal orientations of said wafers, with a predetermined direction of a treatment system and to use said first primary surface as a surface on which an integrated circuit is to be formed.

20. A process for the fabrication of a semiconductor device, which comprises preparing a semiconductor wafer in which a notch formed on the circumferential portion thereof is formed in plane asymmetry relative to a center plane in the thickness direction of the wafer and discriminating a principal surface on the obverse from a principal surface on the reverse according to the plane asymmetry of the notch.

21. A process for the fabrication of a semiconductor device according to item 20, which comprise recognizing the plane asymmetry of the notch by making use of a reflected light from the outside surface of the notch and thereby distinguishing between the primary surfaces of the obverse and reverse of the semiconductor wafer.

22. A process for the fabrication of a semiconductor device according to item 20, wherein said semiconductor wafer has been double-side mirror polished, a semiconductor device is formed on the side of the primary surface on said obverse which can be discriminated by plane asymmetry of said notch, and the side of the primary surface on said reverse is used for the handling of said semiconductor wafer.

23. A process for the fabrication of a semiconductor device according to item 20, wherein in said semiconductor wafer, the primary surface on the obverse which surface can be discriminated by plane asymmetry of said notch has been mirror-finished.

24. A method for the fabrication of a semiconductor device according to item 20, wherein the position of said notches and said primary surfaces on the obverse can be aligned, respectively when said semiconductor wafers are subjected to the same treatment.

25. A semiconductor wafer, wherein a notch formed on a circumferential portion of said wafer is formed asymmetrical relative to a center plane in the thickness direction.

26. A semiconductor wafer, which has, in a notch formed on a circumferential portion of said semiconductor wafer, a chamfered portion on an inner periphery of one primary surface and a chamfered portion on an inner periphery of the other primary surface, said chamfered portions being formed differently each other.

27. A semiconductor wafer according to item 26, wherein said chamfered portion formed on the inner periphery of said one primary surface is at least in part equipped with a flat plane inclined at a predetermined angle relative to said primary surface.

28. A semiconductor wafer according to item 26, wherein a circumferential chamfered portion is formed over the circumferential portion with a predetermined width, and a circumferential chamfered portion formed on an outer periphery of said one primary surface coincides with a circumferential chamfered portion formed on an outer periphery of said other primary surface each other.

29. A semiconductor wafer according to item 26, wherein a side surface of said circumferential portion and a center portion of an inner circumferential side of said notch are formed as convexes at center portions in their thickness directions, respectively.

30. A semiconductor wafer according to item 25, wherein both of said primary surfaces have been mirror-finished.

31. A semiconductor wafer according to item 25, wherein one of said primary surfaces has been mirror-finished.

32. A semiconductor wafer according to item 25, wherein a surface orientation has been formed as on-orientation.

33. A semiconductor wafer according to item 25, wherein a surface orientation has been formed as off-orientation and a relation of said orientation has been maintained on both of said primary surfaces on the obverse and reverse which can be discriminated by plane asymmetry of said notch.

34. A process for the fabrication of a semiconductor wafer, which comprises forming, in a notch formed on a circumferential portion of said semiconductor wafer, chamfered portions which are different each other on inner peripheries of both principal surfaces, respectively and thereby forming said notch plane-asymmetrical relative to a center plane in the thickness direction.

35. A process for the fabrication of a semiconductor wafer according to item 34, wherein a grinding tool, which has a grinding plane for chamfering one inner periphery of said notch and has another grinding plane for chamfering the other inner periphery, said planes being different in shape each other, is applied to said notch to form said each chamfered portion.

36. A process for the fabrication of a semiconductor wafer according to item 35, wherein a grinding tool, which chamfers sad notch at a center portion in a thickness direction in an inner circumferential side and has a processing plane formed in the concaved and curved shape, is applied to said notch to conduct chamfering of said notch.

BRIEF DESCRIPTION OF THE DRAWINGS

FIG. 1 shows a notched wafer according to one embodiment of the present invention, wherein

FIGS. 4 are schematic views of main steps in which

FIGS. 6(a) and 6(b) are front cross-sectional view illustrating a transferring work in a thermal treatment step;

FIG. 8 illustrates a notched wafer according to the second embodiment of the present invention, in which

FIG. 9 illustrates a notched wafer according to the third embodiment of the present invention, in which FIG. 10 illustrates a notched wafer according to the third embodiment of the present invention, in which

DETAILED DESCRIPTION OF THE PREFERRED EMBODIMENTS

Figure 1A:
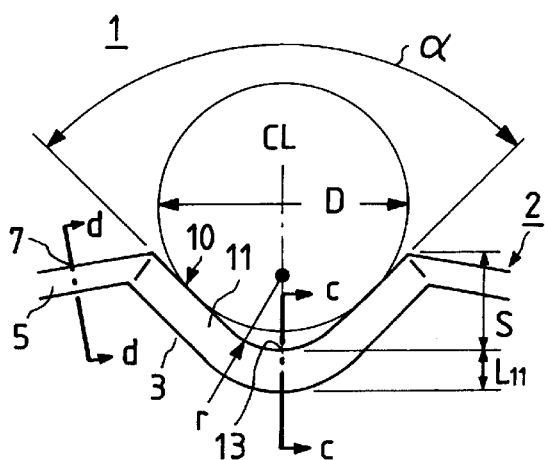
FIG. 1(a) is a plan view of the notch portion, FIG. 1(b) a base view of the notch portion, FIG. 1(c) an enlarged side cross-sectional view taken along a line c—c of FIG. 1(a), and FIG. 1(d) an enlarged side cross-sectional view taken along a line d—d of FIG. 1(a)
Figure 1B:
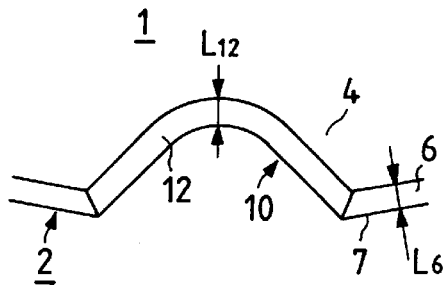
Figure 1C:
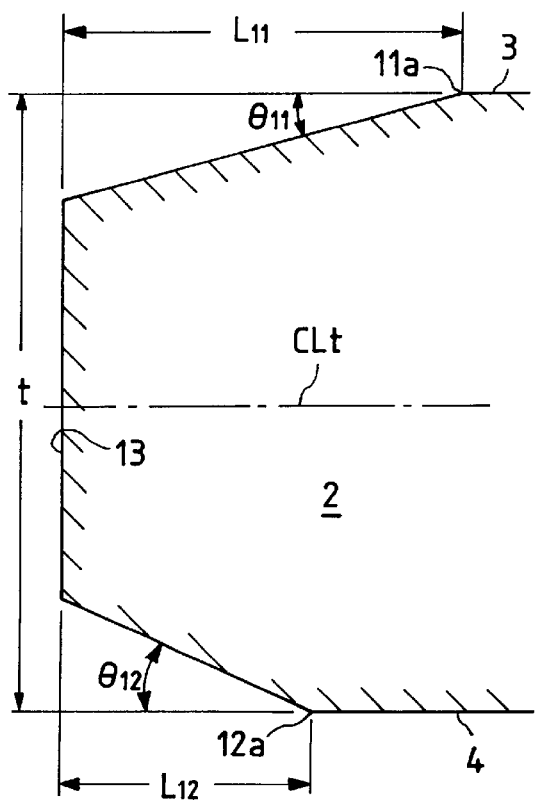
Figure 1D:
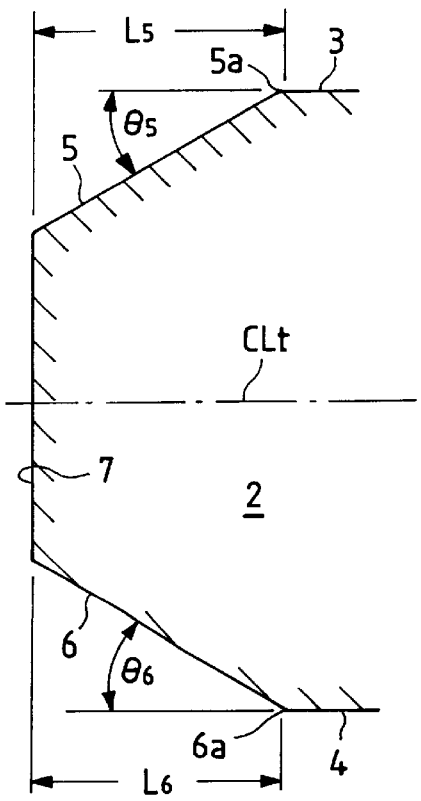

FIG. 1 shows a notched wafer according to one embodiment of the present invention, wherein FIG. 1(a) is a plan view of the notched portion, FIG. 1(b) a base view of the notch portion, FIG. 1(c) an enlarged side cross-sectional view taken along a line c—c of FIG. 1(a), and FIG. 1(d) an enlarged side cross-sectional view taken along a line d—d of FIG. 1(a). FIGS. 2 are schematic views each showing a process to discriminate the obverse from the reverse of the notched wafer according to one embodiment. FIG. 3 is a flow chart showing a fabrication process of a notched wafer according to one embodiment of the present invention. FIGS. 4 are schematic views of main steps, respectively. FIG. 5 is a schematic view illustrating the obverse and reverse discrimination step in a fabrication method of IC using a notched wafer according to one embodiment of the present invention. FIGS. 6 are front cross-sectional views each illustrating a transferring work in a thermal treatment step. FIGS. 7 are schematic views each illustrating a notch position recognizing method in an exposure step.

In this embodiment, a semiconductor wafer of the present invention is constructed as a notched wafer 1 used for the fabrication of IC as a semiconductor device and is equipped with a substrate 2 formed into a circular thin plate shape from a silicon single crystal. In this embodiment, the substrate 2 has been formed in a circular thin-plate form having a diameter of 200 mm and a thickness of 725 µm. The plane orientation of the silicon single crystal substrate 2 is set at on-orientation of (100)+1°. A pair of primary surfaces 3,4 of the substrate 2, that is, a pair of end surfaces of the circular thin plate have been mirror polished. When it is necessary to make a discrimination between a pair of the primary surface 3 and the primary surface 4, the former one and the latter one will hereinafter be called a first primary surface 3 and a second primary surface 4, respectively.

The principal surface 3 of the substrate 2 has a first circumferential chamfered portion 5 formed at the outer periphery thereof. This first circumferential chamfered portion 5 is constructed as a so-called C chamfered portion having an inclination $\theta_5$. The second principal surface 4 of the substrate 2 has a second circumferential portion 6 formed at the outer periphery thereof and this second circumferential chamfered portion 6 is constructed as a so-called C chamfered portion having an inclination $\theta_6$. In this embodiment, the first circumferential chamfered portion 5 and the second circumferential chamfered portion 6 are formed to be plane-symmetrical relative to a center plane in the thickness direction of the substrate 2. Described specifically, as is shown in FIG. 1(d), the first circumferential chamfered portion 5 and the second circumferential portion 6 are formed plane symmetrical relative to a plane which contains a center line CLt in the thickness direction and crosses at right angles (parallel to the primary surfaces 3,4) with a center line passing through a center point of the substrate 2 in the thickness direction. In other words, the inclination $\theta_5$ of the first circumferential chamfered portion 5 and the inclination $\theta_6$ of the second circumferential chamfered portion 6 are set equal and in addition, the distance $L_5$ from the outer peripheral end 7 of the substrate to the chamfer starting position 5a in the first circumferential chamfered portion 5 and the distance $L_6$ from the outer peripheral end 7 of the substrate to the chamfer starting position 6a in the second circumferential chamfered portion 6 are also set equal.

In the substrate constructed as described above, the first principal surface 3 cannot be discriminated from the second principal surface 4 in external appearance.

At the circumferential portion of the substrate 2, a notch 10 which is in a substantial V-shape from the plan view is positioned in the direction of <011> and the shape of the notch 10 in the circumferential direction is formed bilaterally symmetrical relative to the center line CL which passes through the center point of the substrate 2 and the point of the V-shape (said center line will hereinafter be called "reference line"). An opening angle a between the two oblique sides of the V-shape of the notch is set at about 90 degree and an inscribed circle in these two oblique sides is set to have a diameter D of 3 mm. At the bottom of the V shape of the notch 10, formed is a concave curved surface having a minimum blend diameter of 0.9 mm. The depth S (the distance from the outer peripheral end 7 of the substrate 2 to the bottom) of the notch 10 is set at about 1 mm. As described above, the notch 10 is formed plane-symmetrical in the plan view so that it is impossible to make a discrimination between the observe and reverse of the notched wafer 1 only from the plane shape of the notch 10. Incidentally, <011> includes all the directions equivalent to those of [011].

The notch 10 has a first notch chamfered portion 11 on the internal periphery of the first principal surface 3. This first notch chamfered potion 11 is constructed as a so-called C chamfered portion having an inclination $\theta_{11}$ (hereinafter called "first notch chamfered angle"). At the internal periphery of the second principal surface 4 of the notch 10, a second notch chamfered portion 12 is formed and this second notch chamfered portion 12 is constructed as a so-called C chamfered portion having an inclination $\theta_{12}$ (hereinafter called "second notch chamfered angle"). In this embodiment, the first notch chamfered portion 11 and the second notch chamfered portion 12 are formed to be plane asymmetrical relative to the center plane in the thickness direction of the notch 10. In other words, as described in FIG. 1(b), the first notch chamfered portion 11 and the second notch chamfered portion 12 are formed plane asymmetrical relative to the plane which contains a center line CLt in the thickness direction and crosses the center line of the substrate 2 at right angles. Described specifically, the first notch chamfered angle $\theta_{11}$ of the first notch chamfered portion 11 is set smaller than the second notch chamfered angle $\theta_{12}$ of the second notch chamfered portion 12 and the distance $L_{11}$ (hereinafter called "first notch chamfered width") from the internal peripheral end 13 to the chamfer starting position 11a in the first notch chamfered portion 11 is set longer than the distance (hereinafter called "second notch chamfered width") $L_{12}$ from the internal peripheral end 13 to the chamfer starting position 12a in the second notch chamfered portion 12.

In this embodiment, the first notch chamfered angle $\theta_{11}$ and the second notch chamfered angle $\theta_{12}$ are set at 15° and 25°, respectively. The first notch chamfered width $L_{11}$ and the second notch chamfered width $L_{12}$ are set at 500 µm and 300 μm, respectively. The first circumferential chamfered angle $\theta_5$ and second circumferential chamfered angle $\theta_6$ are each set at 30° and the first circumferential chamfered width $L_5$ and the second circumferential chamfered width $L_6$ are each set at 300 μm. In other words, the first notch chamfered width $L_{11}$ are set equal to the first circumferential chamfered width $L_5$ and the second circumferential chamfered width $L_6$, and the second notch chamfered width $L_{12}$ is set equal to the first circumferential chamfered width $L_5$ and the second circumferential chamfered width $L_6$. Accordingly, when the notch chamfered width $L_{11}$ is longer than the circumferential chamfered width $L_5$, the surface is judged as the principal surface on the side of the first notch chamfered portion 11, that is, the first principal surface 3. When the notch chamfered width $L_{12}$ is equal to the circumferential chamfered width $L_6$, the surface is judged as the principal surface on the side of the second notch chamfered portion 12, that is the second principal surface.

In this embodiment, the first notch chamfered portion 11 and the second notch chamfered portion 12 is formed as plane asymmetrical relative to the center plane in the thickness direction of the notch 10 as described above so that it is possible to make a discrimination between the obverse and reverse of the notched wafer 1, that is the first principal surface 3 and the second principal surface 4 by making a discrimination between the first notch chamfered portion 11 and the second notch chamfered portion 12. In other words, when the first notch chamfered portion 11 is recognized, it is found that the side on which the first notch chamfered portion 11 is positioned is the side of the first primary surface 3 and the side on which the portion 11 is not positioned is the side of the second primary surface 4.

Description will next be made of the discrimination method of the first notch chamfered portion 11 and the second notch chamfered portion 12.

In the case of conducting discrimination by visual observation, the first notch chamfered portion 11 and the second notch chamfered portion 12 can be discriminated easily by actually and visually comparing in the length between the first notch chamfered width $L_{11}$ and the second notch chamfered width $L_{12}$ of the notched wafer 1 and then judging which is longer. In this case, the first notch chamfered width $L_{11}$ is set larger than the first circumferential chamfered width $L_5$ so that by visually comparing the first notch chamfered width $L_{11}$ with the first circumferential chamfered width $L_5$ which are adjacent each other and judging which is longer, the side of the first notch chamfered portion 11 can be discriminated. When it is difficult to visually compare the notch chamfered width with the circumferential chamfered width which are adjacent each other and to judge which is longer, it is judged that there is a possibility of the side being not the first notch chamfered portion 11.

Alternatively, in the case of conducting discrimination according to the judgment using a picture of a TV camera, the first notch chamfered portion 11 can be discriminated easily from the second notch chamfered portion 12 by visually comparing the first notch chamfered width $L_{11}$ and the second chamfered width $L_{12}$ on a TV picture of the notched wafer 1 and judging which is longer. The chamfered portion is inclined relative to the primary surface so that on the picture of the notched wafer 1 on the TV camera, the chamfered portion is darker than the primary surface. A worker can therefore recognize the first notch chamfered width $L_{11}$ and the second notch chamfered width $L_{12}$ on the TV picture of the notched wafer 1. It is also possible to recognize the first notch chamfered width $L_{11}$ by visually comparing the first notch chamfered width $L_{11}$ and the first circumferential chamfered width $L_5$ which are adjacent each other.

On the picture of the notched wafer on the TV camera, the chamfered portion is darker than the primary surface so that by setting a threshold at the optimum value in the picture on the TV camera, the first notch chamfered width $L_{11}$ and the second notch chamfered width $L_{12}$ can be recognized automatically by the picture on the TV camera. By automatically recognizing the first notch chamfered width $L_{11}$ and the second notch chamfered width $L_{12}$, a discrimination between the first notch chamfered portion 11 and the second notch chamfered portion 12 can be made automatically.

The first notch chamfered angle $\theta_{11}$ of the first notch chamfered portion 11 is set smaller than the second notch chamfered angle $\theta_{12}$ so that it is also possible to discriminate the first notch chamfered portion 11 from the second notch chamfered portion 12 by using the difference in a chamfered angle. FIG. 2 is a schematic view illustrating one embodiment of a method for the discrimination of the first notch chamfered portion 11 and the second notch chamfered portion 12 by making use of a chamfered angle, in short, for the discrimination between the obverse and reverse of the notched wafer.

A chamfered angle discriminator 20 which is illustrated in FIG. 2 and is used in an obverse-reverse discrimination method of a wafer is equipped with a parallel degree measuring instrument and a chamfered angle measuring instrument. The parallel degree measuring instrument 21 is designed to be under the conditions capable of always keeping a parallel state in a measurement stage and is equipped with an area photosensor 22 and a projector 23. The projector 23 is disposed in the center of the area photosensor and is constructed to always project light vertically to the measurement stage. The area photosensor 22 is constructed to receive the reflected light from the side of the measurement stage and send electric signals showing the light-receiving position to a controller 24. The chamfered angle measuring instrument 25 is disposed at the position on the notch side of the parallel degree measuring instrument 21 and is installed with an inclination at a predetermined angle (herein set at the first notch chamfered angle $\theta_{11}$) relative to the parallel degree measuring instrument 21 with a predetermined angle. The chamfered angle measuring instrument 25 is also equipped with an area photosensor 26 and a projector 27. The projector 27 is disposed on the center of the area photosensor 26 and is constructed so that it can always project light vertically (at right angles) to the inclined surface. The area photosensor 26 is constructed to receive the reflected light from the measurement stage and send electric signals showing the light receiving position to the controller 24.

Upon discrimination of the first notch chamfered angle $\theta_{11}$ by the chamfered angle discriminator 20 having the above-described structure, parallel-degree measuring light 28a is irradiated by the projector 23 of the parallel degree measuring instrument 21 to the vicinity of the notch of the first primary surface 3 of the notched wafer 1 which has been set on the measurement stage and then, the reflected light 28b totally reflected on the first primary surface 3 is received by the area photosensor 22 of the parallelization degree measuring instrument 21. The area photosensor 22 sends coordinate signals showing the light receiving position to the controller 24.

The chamfered angle measuring light 29a is then irradiated by the projector 27 of the chamfered angle measuring instrument 25 to the inclined surface of the first notch chamfered portion 11 of the notch 10 and the reflected light 29b totally reflected on the inclined surface is received by the area photosensor 26 of the chamfered angle measuring instrument 25. The areaphotosensor 26 sends coordinate signals showing the light receiving position to the controller 24.

Figure 2A:
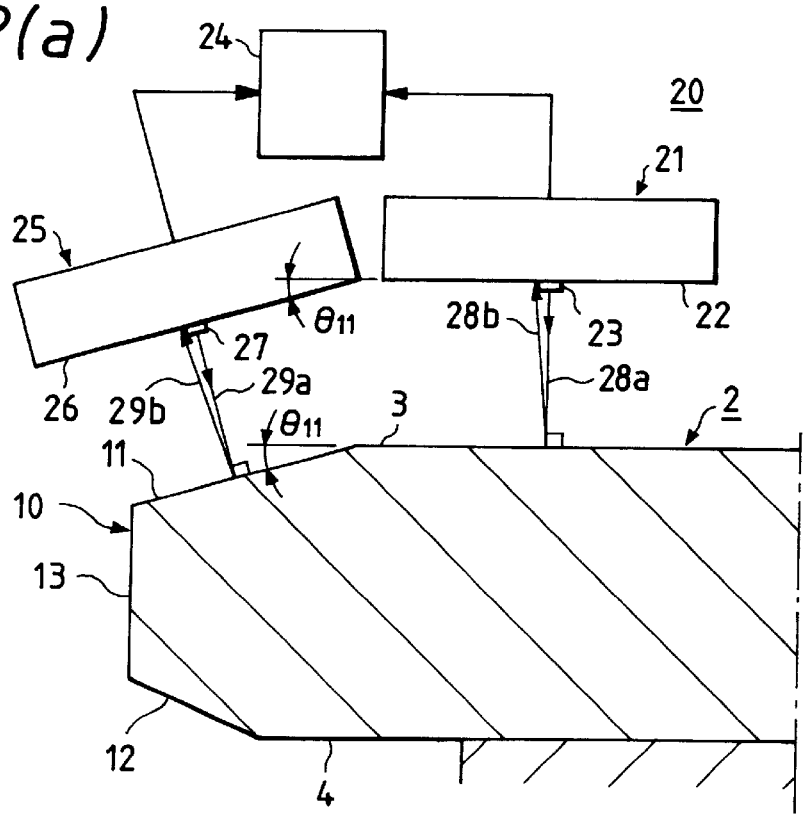
FIGS. 2(a) and 2(b) are schematic views showing processes to distinguish between the obverse and reverse of the notched wafer, respectively according to one embodiment.
Figure 3:
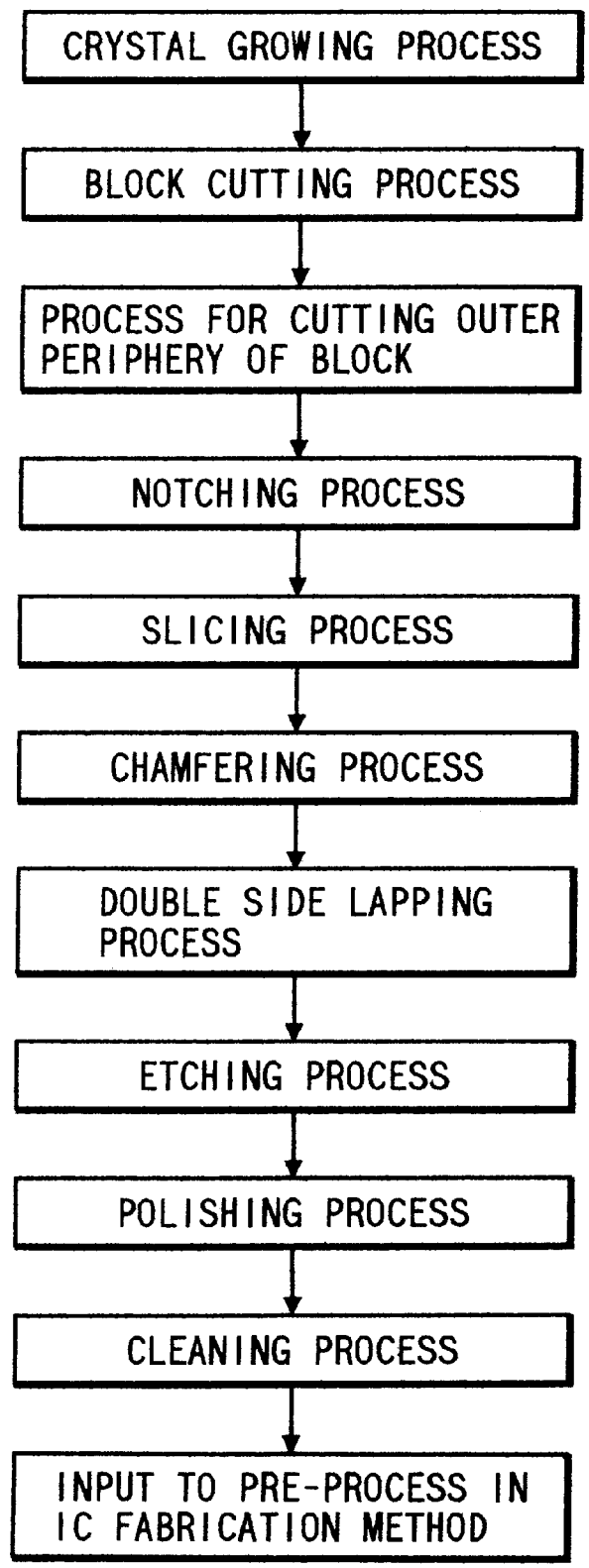
FIG. 3 is a flow chart showing a fabrication process of a notched wafer according to one embodiment of the present invention.

When the notched wafer 1 is set parallel as illustrated in FIG. 2(a), coordinate signals showing that the light receiving position is on the center is sent to the controller 24 from the area photosensor 26 of the chamfered angle measuring instrument 25. The controller compares the coordinate value with a predetermined reference value and if the difference falls within a predetermined tolerance, it judges that the chamfered angle under measurement is the inclination $\theta_{11}$ of the first notch chamfered portion 11.

Figure 2B:
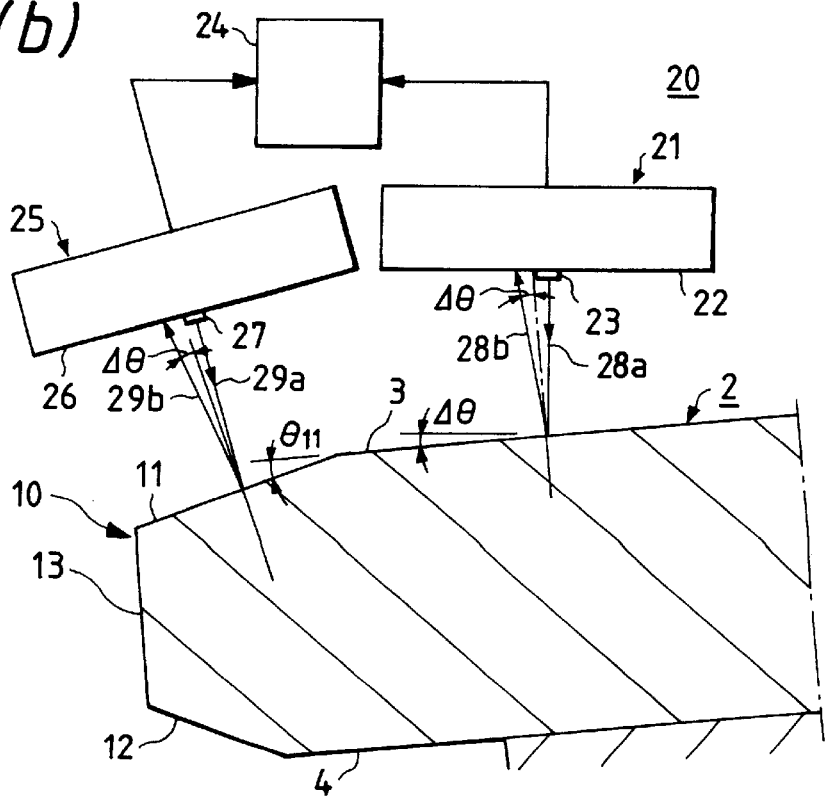

As illustrated in FIG. 2(b), on the other hand, when the notched wafer 1 is set with inclination, the coordinate signals showing that the light receiving position is off the center is sent from the area photosensor 22 of the parallel-degree measuring instrument 21 to the controller 24. The coordinate value then shows the inclination $\Delta\theta$ of the notched wafer.

From the area photosensor 26 of the chamfered angle measuring instrument 25, the coordinate signals showing that the light receiving position is off the center is sent to the controller 24. These coordinate signals indicate the condition that the inclined plane exposed to the measuring light 29a of the chamfered angle measuring instrument 25 has an additional inclination of angle $\Delta\theta$. The controller 24 compensates the coordinate value of the position distant from the area photosensor 26 of the chamfered angle measuring instrument 25 by the coordinate value of the position distant from the area photosensor 22 of the parallel degree measuring instrument 21, whereby the coordinate value equal to FIG. 2(a) is determined. This coordinate value is compared with a predetermined reference value and when the difference falls within a predetermined range of tolerance, the chamfered angle so measured is judged as the inclination $\theta_{11}$ of the first notch chamfered portion 11.

Description will next be made of a process for the fabrication of the notched wafer relating to the above-described construction by using the flow chart shown in FIG. 3 and a schematic view of main steps shown in FIG. 4.

First, in a single crystal growing process by the Czochralski method, single crystals are caused to glow in a solution in which monocrystalline silicon has been dissolved, whereby a single crystal ingot (unillustrated) is fabricated.

In a block cutting step, the monocrystalline ingot is cut into blocks each having a resistance within a predetermined range.

In a step for grinding the outer periphery of the block, the block is ground into the form of a completely round cylinder having a uniform diameter.

In a notching step, into the outer periphery of the cylindrical block 31, a vertical groove 30 which will be a notch 10 later, is cut by a diamond blade (unillustrated). At this time, the orientation of the crystal plane of the single crystal block 31 is measured by X-ray inspection and the vertical groove 30 is disposed accurately at the position of the direction <011> of the single crystal block 31. The cross-sectional shape of the vertical groove 30 corresponds to the V-shape of the notch 10 in its plane view.

Figure 4A:
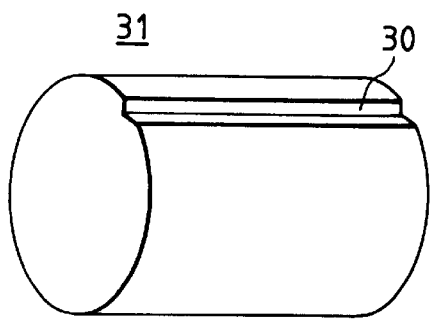
FIG. 4(a) is a perspective view after a step of notching, FIG. 4(b) a perspective view of a slicing step, FIG. 4(c) a plan view after chamfering step, FIG. 4(d) a side cross-sectional view, FIG. 4(e) a partially-cut plan view of a chamfering step and FIG. 4(f) its side cross-sectional view.
Figure 4B:
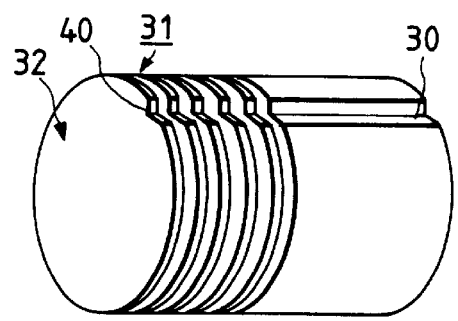
Figure 5:
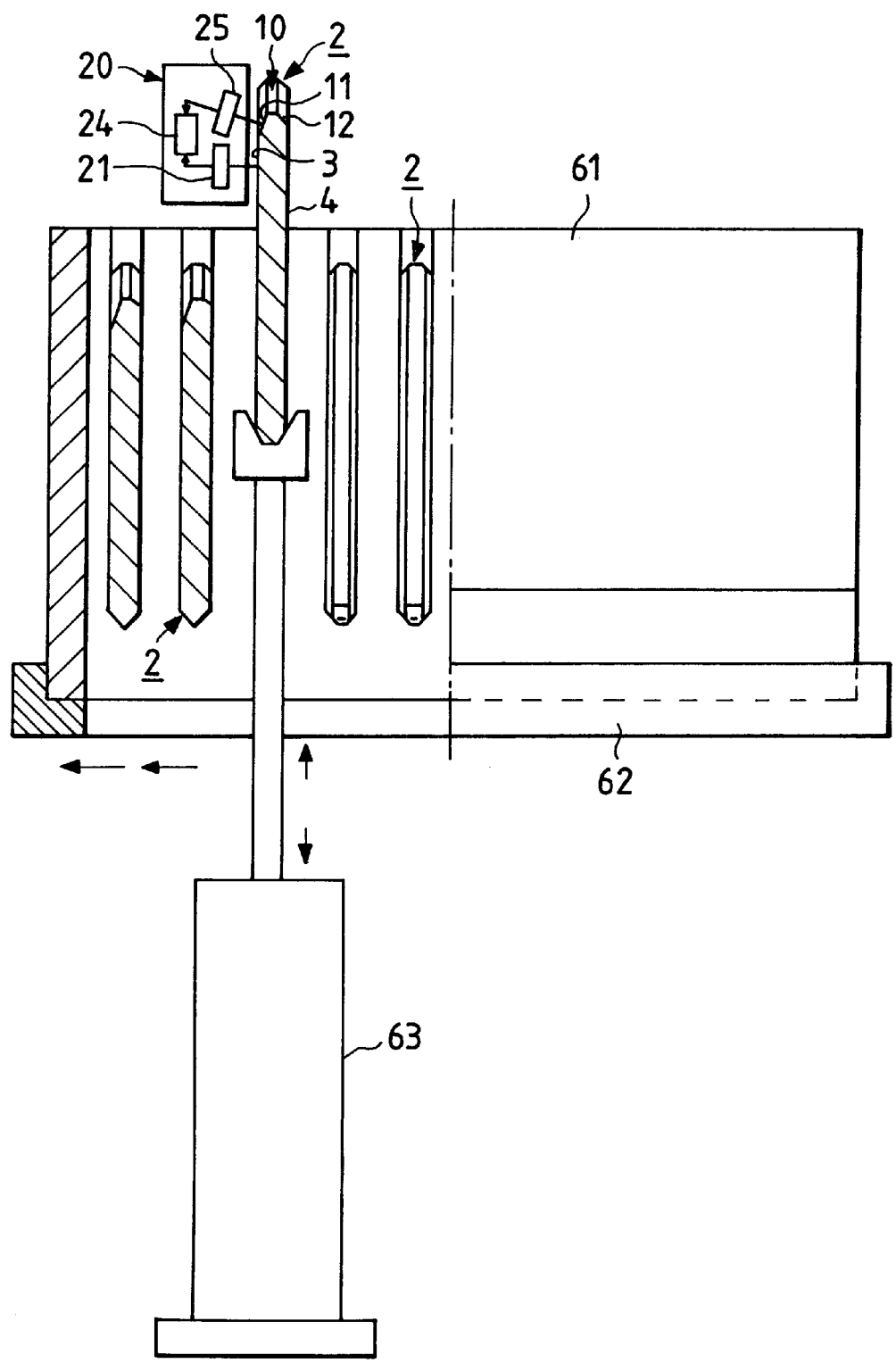
FIG. 5 is a schematic view illustrating an obverse-reverse discrimination step in a fabrication process of IC using a notched wafer according to one embodiment of the present invention.
Figure 7D:
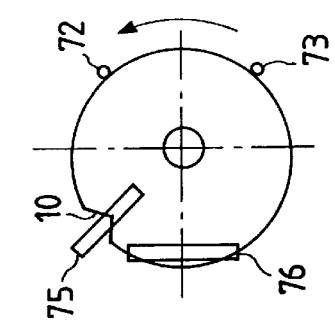
FIGS. 7(a), 7(b), 7(c), 7(d), 7(e), 7(f) and 7(g) are schematic views illustrating a notch position recognizing method in an exposure step.
Figure 7C:
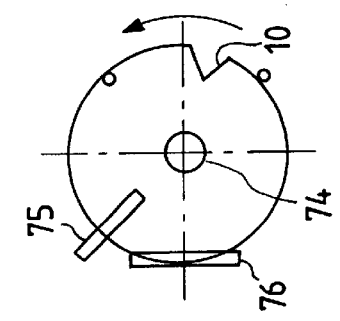
Figure 7B:
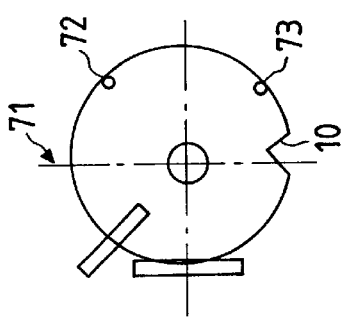
Figure 7A:
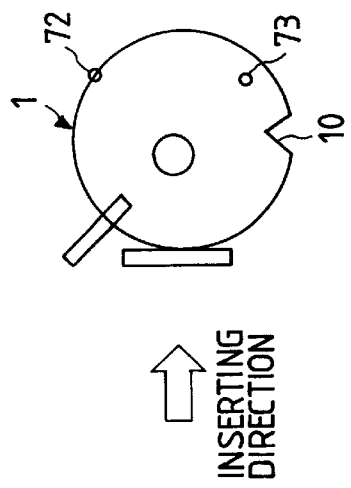
Figure 7E:
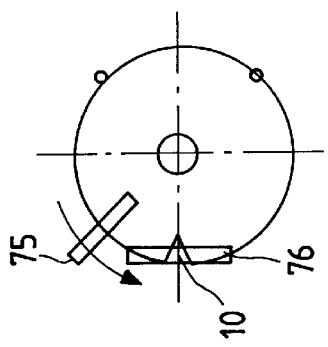
Figure 7F:
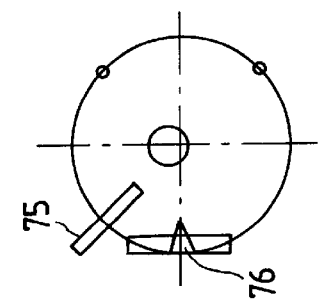
Figure 7G:
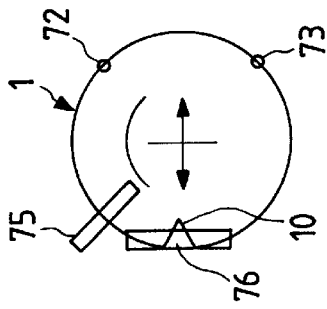
Figure 7H:
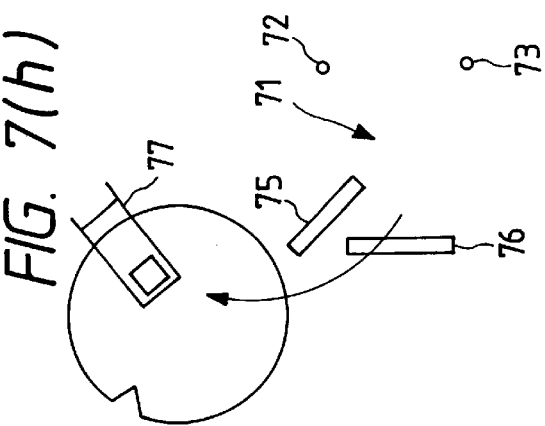

In a slicing step, as illustrated in FIG. 4(b), the vertical-groove-formed block is cut into a circular thin plate by an ID saw diamond blade. On a thin plate thus formed by cutting (hereinafter called "thin plate"), a V-shaped groove 40, which will become the notch 10 by processing the chamfered portion later, is formed. The thin plate 32 is formed a little larger than the final size of the substrate 2 in the notched wafer 1 in consideration of the lapping margin, etching margin, polishing margin and the like. Similarly, the V-shaped groove 40 is a little smaller than the finish size of the notch 10. The thin plates 32 are stored with the positions of their V-shaped grooves 40 trued up and placed in a single file on a carrier jig (unillustrated).

Figure 4C:
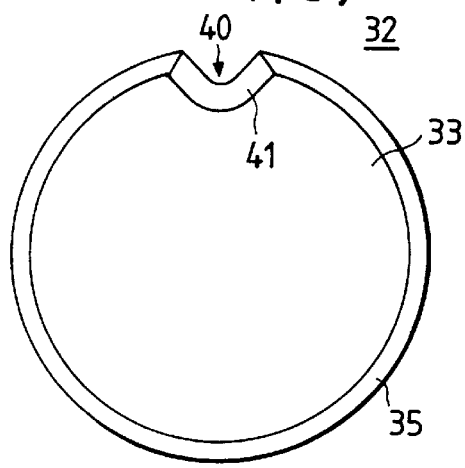
Figure 4D:
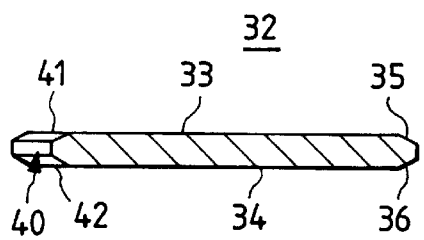

In a chamfering step (beveling step), as illustrated in FIGS. 4(c) and (d), at the circumferential portion of the thin plate 32, a first circumferential chamfered portion 35 and a second circumferential chamfered portion 36, are formed respectively. Incidentally, the numeral "35" is used to distinguish the above portion from that of the finished product obtained after lapping, etching, polishing and the like. So is the case of the chamfered portion and primary surface. At the both inner peripheries of the V-shaped groove 40 of the thin plate 32, a first notch chamfered portion 41 and a second notch chamfered portion 42 are formed, respectively. These portions correspond to the above-described chamfered portions of the notched wafer 1, which is a finished product, although the lapping, etching and polishing margins are included. When the first notch chamfered 41 and the second notch chamfered portion 42 are formed on the V-shaped groove 40, it becomes possible to make a discrimination between the obverse and the reverse of the thin plate 32. Described specifically, in the V-shaped groove 40, the primary surface on the side where an inner periphery having the first notch chamfered portion 41 formed thereon becomes the first primary surface 33, while the primary surface on the side where an inner periphery having the second notch chamfered portion 42 formed thereon becomes the second primary surface 34.

Figure 4E:
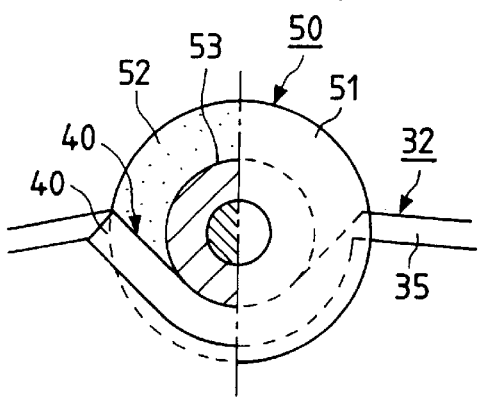
Figure 4F:
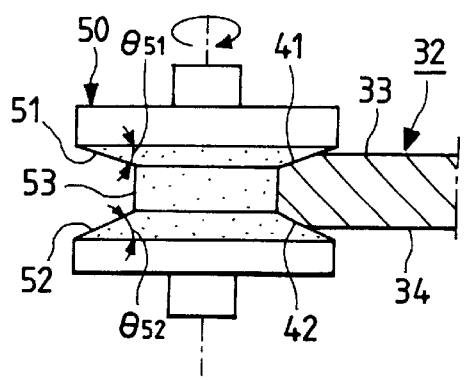

Description will next be made of one embodiment of a chamfering step to form the first notch chamfered portion 41 and the second notch chamfered portion 42 on the V-shaped groove 40 in the case where a grinding tool 50 illustrated in FIGS. 4(e) and (f) are used.

The grinding tool 50 is in the form of a substantially cylinder having a concave curved surface on its outer circumferential surface. It has a diamond abrasive grain layer formed on its outer circumferential surface and accordingly, is constructed of a first grinding plane 51, a second grinding plane 52 and a third grinding plane 53 are constructed. The first grinding plane 51 and the second grinding plane 52 are in the conical form and arranged opposite to each other on the same shaft. The bottom angle $\theta_{54}$ of the first grinding plane 51 is set equal to the first notch chamfered angle $\theta_{11}$ and the bottom angle of $\theta_{52}$ is set equal to the second notch chamfered angle $\theta_{12}$. The third grinding plane 53 is formed as a cylinder concentric to a rotation center and the radius in the third grinding plane 53 is set so as to correspond to the radius r of curvature of the concave curved surface in the inner peripheral end 13 of the notch 10.

Upon conducting a chamfering step to form the first notch chamfered portion 41 and the second notch chamfered portion 42 on the V-shaped groove 40 by using the grinding tool 50, the grinding tool 50 is turned with the rotation center being disposed parallel to the center line of the thin plate 32 and is sent gradually along the shape of the inner circumferential plane of the V-shaped groove 40. By this grinding work, the first notch chamfered portion 41 having the first notch chamfered angle $\theta_{11}$ and the second notch chamfered portion 42 having the second notch chamfered angle $\theta_{12}$ are formed on the both ends of the V-shaped groove 40, respectively.

After the chamfering of the V-shaped groove 40 is conducted, it becomes possible to make a discrimination between the obverse and the reverse of the thin plate 32, that is, whether the surface is the first primary surface 33 or the second primary surface 34 by making a discrimination between the first notch chamfered portion 41 and the second notch chamfered portion 42. In other words, upon handling of the thin plate 32, treatment manners of its obverse and reverse can be unified, which means that there becomes a situation that advantages and disadvantages by the unification should be submitted. In this embodiment, to unify the treatment manners of the obverse and reverse after the chamfering of the V-shaped groove, the thin plates 32 which have been subjected to chamfering are stored in a carrier jig (refer to FIGS. 5 and 6) with the directions of the first notch chamfered portions 41 being trued up.

In a lapping process, both surfaces of the thin plate 32 are subjected to lapping by alumina grains and abrasives such as glycerine. A variation in the thickness of the thin plate 32 is reduced to, for example, 0.2 μm or less by thin lapping.

In an etching step, the whole surface layer of the thin plate 32 is subjected to etching. On the surface or near the surface of the thin plate 32, cracked layers and/or contaminated layers are produced by the profile processing so far conducted. These cracked and/or contaminated layers can be removed by this etching step. These cracked and/or contaminated have generally a thickness of about 10 μm and can be eliminated sufficiently by chemical etching treatment. For the complete removal of these cracked layers, however, it is the common practice to conduct over etching over the thickness of 20 μm on one side. As an etchant, a mixed solution of hydrofluoric acid, nitric acid and acetic acid may be used. It is also possible to conduct alkali etching using sodium hydroxide or potassium hydroxide.

In a polishing (mirror polishing) step, the both obverse and reverse of the thin plate 32 are subjected to polishing. By this polishing, the both obverse and reverse of the thin plate 32 have mirror-finished surfaces so that their highly-precise surface flatness can be maintained and they are free of local fluctuations. According to this embodiment, the obverse and reverse are treated in a unified manner after the notch chamfering step so that for example, the side of the primary surface can always be subjected to a lithographic treatment as will be described later. In other words, it is possible to say that polishing is necessary for only the first primary surface. The polishing on the second primary surface makes it possible to enhance the highly-precise surface flatness and to eliminate the local fluctuations from the both surfaces, thereby improving the flatness of the notched wafer 1 upon the lithographic treatment. For polishing, either mechanical or chemical polishing can be employed.

As described above, the notched wafer 1 having the above construction is formed. The notched wafer 1 so formed is sent from a wafer production plant to an IC fabrication plant after cleaning in a final cleaning step and then being packed in a carrier jig. A plural number of the notched wafers 1 are packed in a carrier jig under the conditions that the positions of the notches 10 and the directions of the first notch chamfered portions 11 are trued up.

Description will be next made of one embodiment of the fabrication process, with respect to its preprocess, of IC using the notched wafer manufactured and constructed as described above.

When the notched wafer having the above-described construction is applied to the preprocess, the obverse and reverse of the notched wafer are confirmatively discriminated by the difference in the chamfered portions of the notch. As illustrated in FIG. 5, the above-described chamfered angle discriminator 20 can be used for this discrimination work. Described specifically, the chamfered angle discriminator 20 is disposed vertically above a table 62 on which the carrier jig 61 for the notched wafers is placed and held horizontally. Under the table 62, an elevator 63 lifting up the wafer vertically is arranged with its top being set upward. The notched wafer 1 stands vertically under the condition that the carrier jig 61 is kept horizontal to the table 62 and the elevator 63 is constructed to vertically lift up the notched wafer 1 one by one.

Upon the discrimination of the obverse from the reverse, when the notched wafer 1 is lifted up from the carrier jig 61 by the elevator 63, the wafer so lifted up is placed opposite to the chamfered angle discriminator 20. Then, in accordance with the procedures described in FIG. 2, the chamfered angle discriminator 20 discriminates whether the angle is the first notch chamfered angle $\theta_{11}$ or not and confirms that the first primary surface 3 is arranged properly on the side of the chamfered angle discriminator 20. After the completion of the confirmation, the elevator goes down and the wafer 1 returns to the original position in the carrier jig 61. Then, the table 62 is sent pitch by pitch, thereby positioning the next wafer 1 opposite to the elevator 63.

The obverse and reverse of all the wafers 1 stored in the carrier jig 61 are discriminated by repeating the above operation. If, by some rare accident, the angle is not judged as the first notch chamfered angle $\theta_{11}$ by the chamfered angle discriminator 20, an alarm is sounded from the controller 24. Judging that the notched wafer 1 is stored in the carrier jig 61 with the obverse and reverse being inverted, the worker picks it from the carrier jig 61 and returns it to the cleaning process or the like. The notched wafer 1 arranged with the obverse and reverse being inverted is treated with a special care because there is a possible danger of the first primary surface 3 being contaminated when used as a surface to be handled.

After the completion of the discrimination of the obverse from the reverse, an integrated circuit containing a semiconductor device therein is fabricated on the side of the first primary surface of the notched wafer, which is the primary surface on the obverse in the preprocess and the second primary surface as the primary surface on the reverse is used for its handling. The notched wafers whose obverse and reverse having been discriminated are therefore always treated with the positions of the notches and the directions of the obverse and reverse (directions of the first primary surface and the second primary surface) being trued up.

For example, upon heat treatment to let a silicon oxide film grow in a well patterning process of CMOS, a plural number of notched wafers are simultaneously subjected to so-called batch treatment. These notched wafers have been stocked in the carrier jig with the positions of the notches and the direction of the obverse and reverse being trued up so that it is only necessary to move the notched wafers in the carrier jig to another jig at once in the case of such a batch treatment. For example, as is illustrated in FIG. 6(a), a group of these plural notched wafers 1 stocked in the carrier jig with the positions of the notches 10 and the obverse and reverse being trued up is first transferred at once to a transferring jig 64. As illustrated in FIG. 6(b), this group of the notched wafers 1 on the transferring jig 64 is then transferred collectively as is to a boat 65 which is a heat-treatment jig. This boat is then put into a process tube of a heat treatment apparatus (unillustrated) collectively as is, followed by the heat treatment.

When this boat is heat treated in this manner with the positions of the notches and the direction of the obverse and reverse being in a predetermined relation, the positions of the notched wafers 1 relative to the process tube becomes fixed so that the properties specific to the heat treatment apparatus can be found by analyzing the silicon oxide film so obtained, for example, film thickness, film quality and distribution of electric properties. Upon defective analysis, precision and reliability of defective analysis can be enhanced by specifying the positional relation of the notched wafer 1 relative to the process tube.

At this time, to conduct the wafer process using a so-called round wafer (including a single-side mirror wafer), it is especially important to treat wafers with a predetermined direction, among predetermined, crystallographically equivalent, crystal orientations of the wafer, in alignment with a predetermined direction of each treating apparatus in a batch process, for example, oxidation, CVD or the like or a single wafer processing, for example, etching. It is important to judge a crystal orientation by X-ray or the like in the first step. In subsequent steps, a particular direction may be judged by lithography pattern or the like on the wafer. By conducting the treatment with predetermined crystalline orientations of the round wafers being trued up and feeding back the data on the previous number and sampling inspection to the wafer process, it becomes possible to make easier the analysis of the process and feed back control of the process by monitoring. Incidentally, it is not always necessary to true up the crystalline orientations in each apparatus. It is only necessary to be able to know the specific orientation of the wafer at least in relation to the apparatus.

Upon applying a spinner coating of a photoresist film on a silicon oxide film in a well patterning process of CMOS, notched wafers are treated one by one, that is, treated by single wafer processing. In such single wafer processing, notched wafers are taken out from the carrier jig one by one, followed by the treatment so that it is necessary to return them after trueing up the positions of the notches and the directions of the obverse and reverse. The stopping position of a spin chuck is not fixed so that the positions of the notches after the spinner coating of the notched wafer are not clear. When the spinner-coated notched wafer is set on an exposure device, detection of the position of the notch is required in advance. Description will next be made of one embodiment of the notch position detecting method with reference to FIG. 7.

The spinner-coated notched wafer 1 is inserted to a notch position detection stage 71 by an insertion hand (unillustrated) as described in (a). At the point when a pair of 4-channel sensors (hereinafter called "right and left sensors") 72,73 are shaded from light by the notched wafer 1, the insertion of the insertion hand is stopped. As illustrated in (b), the lag in time between right and left sensors 72,73 are shaded is converted to an eccentric amount in the direction of X, and the stage 71 is moved, whereby the notched wafer 1 is maintained by a vacuum adsorption chuck 74.

As is illustrated in (c), the notched wafer is turned by the vacuum adsorption chuck 74 and then the notch 10 is detected by a notch rough detection sensor 10 as is illustrated in (d). As is illustrated in (e), the notch 10 is then turned by 45° in a counterclockwise direction from the position of the notch rough detection sensor 75 and is transferred to a picture-taking range of a pickup tube 76 constructed of CCD. As is illustrated in (f), the directions of X, Y and θ of the notched wafer 1 are then corrected so that the outer periphery of the notched wafer is brought into contact with both sensors 72,73 with the notch 10 being held on the center of the pick up tube 76.

After the directions of X, Y and θ are subjected to fine tuning, the notched wafer 1 is transferred to an exposure device (unillustrated) by a feeding hand 77 with its state being maintained. Prior to the transfer of the notched wafer to the exposure devise, a work to discriminate the obverse from the reverse is conducted to the notched wafer 1 which has been subjected to fine tuning in the directions of X,Y,θ, whereby it can easily be confirmed that a photoresist film has been coated by spinner coating in practice on the first primary surface 3 of the notched wafer 1.

In the above embodiment, a fabrication process of IC, which is one embodiment of a process of the present invention for the fabrication of a semiconductor device, was described concerning a heat treatment work to let a silicon oxide film grow in the CMOS well patterning process, which is one of the preprocesses, and a work to apply spinner coating of a photoresist film on the silicon oxide film. Throughout the preprocess, the notched wafers whose obverse and reverse have been discriminated are always treated with their notch positions and the direction of the obverse and reverse (the direction of the first primary surface and the second primary surface) being trued up. The notched wafer whose obverse and reverse have been discriminated are used as follows: on the first primary surface which is the obverse, an integrated circuit including a semiconductor device is fabricated and the second primary surface which is the reverse is used for handling of the wafer itself. The primary surface on which the semiconductor device is fabricated is therefore not contaminated by handling, which makes it possible to enhance the production yield of the semiconductor device and also the quality and reliability of the semiconductor device.

According to the above embodiments, the following effects can be obtained:

(1) In the notched wafer, a chamfered portion formed on the inner periphery of one primary surface and a chamfered portion formed on the inner periphery of another primary surface are formed in a different shape. The obverse and reverse of the notched wafer can be discriminated by recognizing the difference between the both chamfered portions and therefore, a primary surface on which a semiconductor device is fabricated can always be identified.

(2) According to (1), in the preprocess, an integrated circuit including a semiconductor device can be fabricated on the first primary surface which is the obverse and the second primary surface which is the reverse can always be used for the handling of the wafer itself so that the first primary surface on which a semiconductor device can be fabricated can be prevented from contamination caused by handling. As a result, not only the production yield but also the quality and reliability of the semiconductor device can be heightened.

(3) The chamfered portions of both surfaces are different, but the plane shape of the notch can be maintained symmetrical in the circumferential direction so that a drastic reduction in the rotation symmetry of the notched wafer and in a number of the semiconductor devices available from the wafer can be prevented. In addition, by keeping the standards for the notch, it is possible to prevent the reform of the notch-using positioning means in the existing fabrication device used for the fabrication of the semiconductor device.

(4) The chamfered portions of the obverse and reverse at the notch are made different so that the obverse and reverse can be discriminated optically by using the reflected light. The discrimination of the obverse and reverse of the notched wafer can therefore be conducted without bringing in contact with the wafer so that the damages caused by the contact can be prevented in advance.

(5) By setting the first notch chamfered angle $\theta_{11}$ of the first notch chamfered portion 11 smaller, the formation of epitaxial crowns upon the epitaxial growth treatment can be prevented and reduction in the number of semiconductor devices available from the wafer can be avoided in advance.

(6) By forming the first notch chamfered portion and the second chamfered portion by a grinding tool which has the first grinding surface and the second grinding surface, both being asymmetrical, the first notch chamfered portion and the second chamfered portion, both being asymmetrical, can be formed very easily so that the increase in the manufacturing cost of the notched wafers can be suppressed.

Figure 8A:
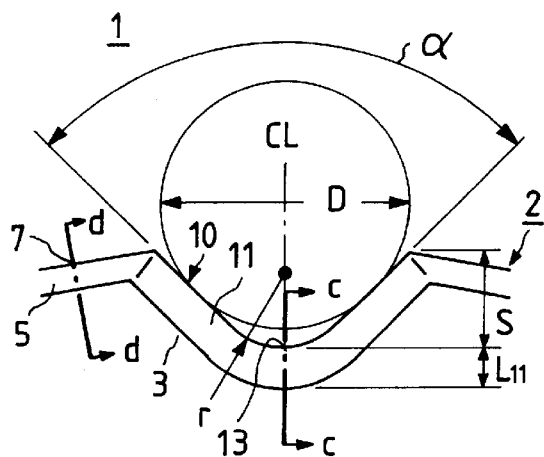
FIG. 8(a) is a plan view of the notched portion, FIG. 8(b) its base view, FIG. 8(c) a cross-sectional view taken along a line c—c of FIG. 8(a) and FIG. 8(d) a cross-sectional view taken along a line d—d of FIG. 8(a)
Figure 8B:
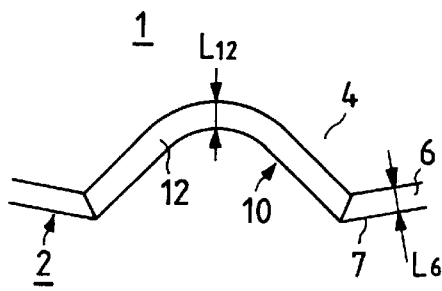
Figure 8C:
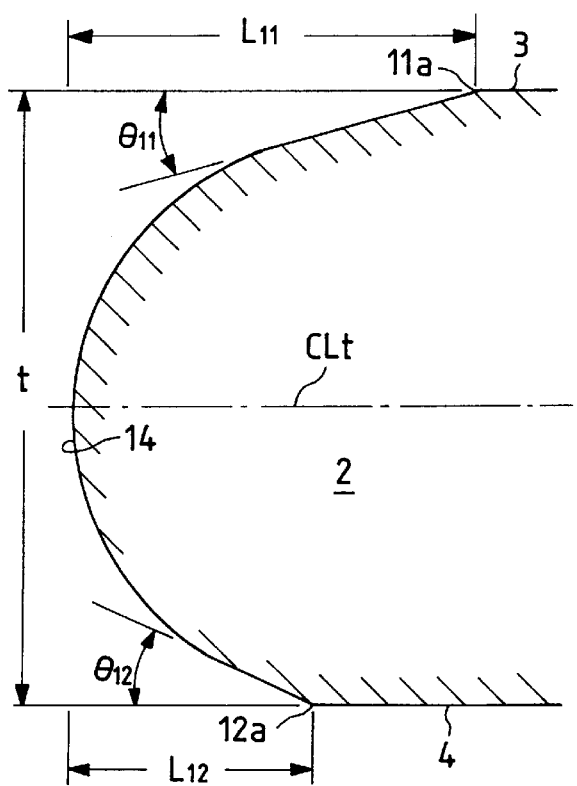
Figure 8D:
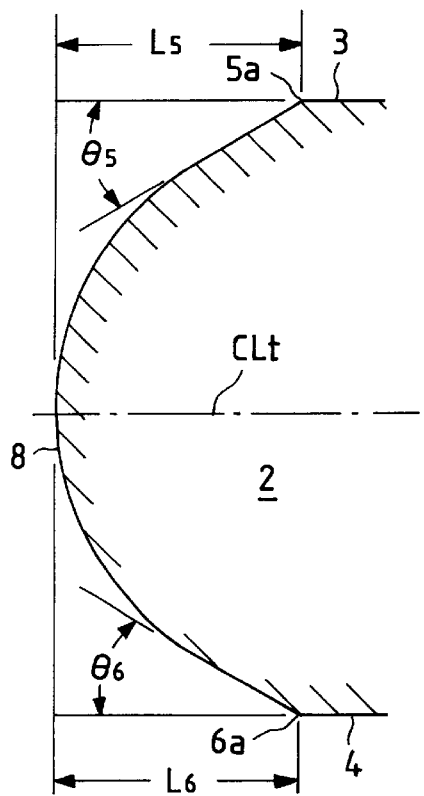

FIG. 8 illustrates a notched wafer according to the second embodiment of the present invention, in which FIG. 8(a) is a plan view of the notched portion, FIG. 8(b) its bottom view, FIG. 8(c) an enlarged side cross-sectional view taken along a line c—c of FIG. 8(a), and FIG. 8(d) an enlarged side cross-sectional view taken along a line d—d of FIG. 8(a).

The difference of the second embodiment from the first embodiment resides in that in the substrate 2 of the notched wafer 1, an R-chamfered portion 8 is formed at an outer periphery 7 of the substrate and also an R chamfered portion 100 is formed at an inner periphery 13 of the notch 10. Here, the R chamfered portion 14 at the inner periphery of the notch is formed as inscribed in the first notch chamfered portion 11 and the second notch chamfered portion 12. And, flat inclined planes are formed with at least a predetermined width on the first notch chamfered portion 11 and the second notch chamfered portion 12, respectively. In the case where chamfered angle measuring light 29a of the chamfered angle discriminator 20 enters to the flat inclined surface of the first notch chamfered portion 11 or the second notch chamfered portion 12, there is a fixed relation between the reflected angle of the reflected light 29b and the chamfered angle so that the it is also possible to make a discrimination of the chamfered angles in this embodiment.

The second embodiment according to the present invention is similar to the first embodiment in its effects. In addition to the effects of the first embodiment, strains or damages at the outer periphery of the substrate 2 and at the inner periphery of the notch 10 can be prevented by the R chamfered portions 8 and 14.

Figure 9A:
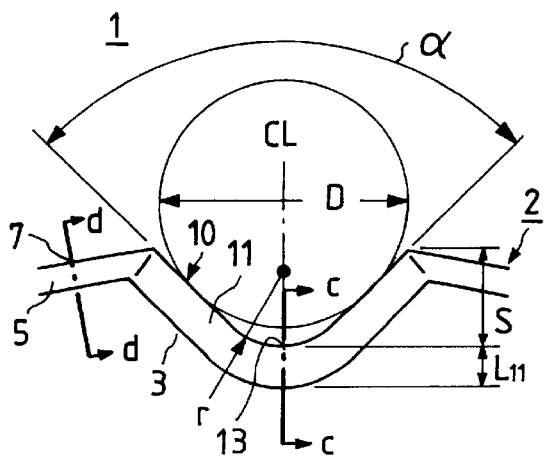
FIG. 9(a) is a plan view of the notched portion, FIG. 9(b) its base view, FIG. 9(c) a cross-sectional view taken along a line c—c of FIG. 9(a) and FIG. 9(d) a cross-sectional view taken along a line d—d of FIG. 9(a)
Figure 9B:
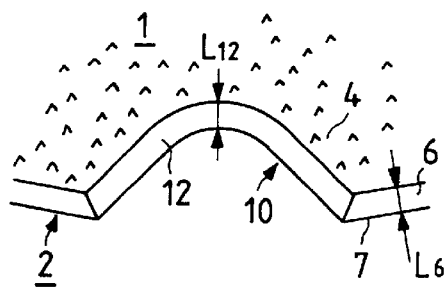
Figure 9C:
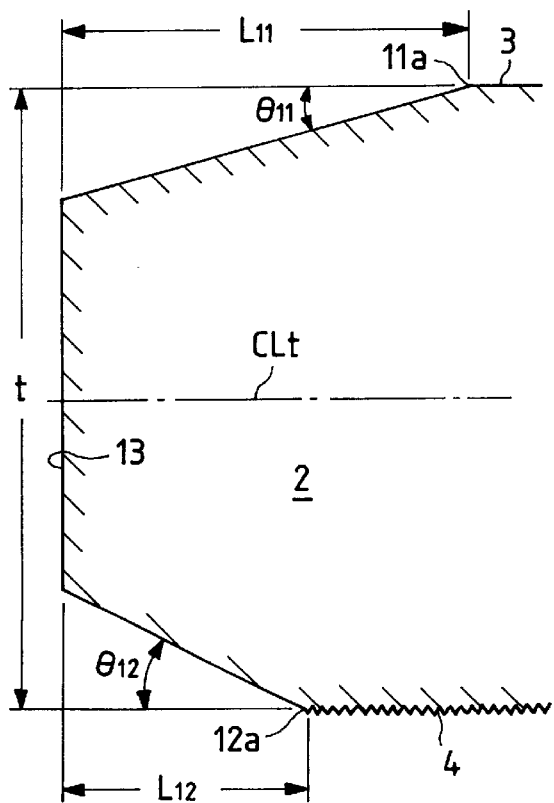
Figure 9D:
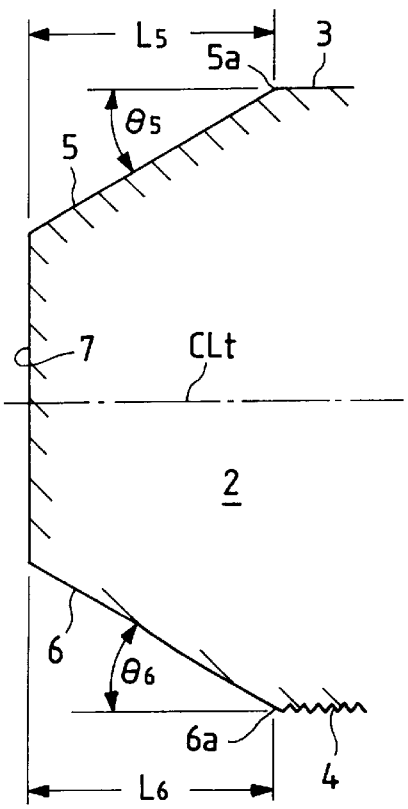

FIG. 9 illustrates a notched wafer according to the third embodiment of the present invention, in which FIG. 9(a) is a plan view, FIG. 9(b) its bottom view, FIG. 9(c) an enlarged side cross-sectional view taken along a line c—c of FIG. 9(a) and FIG. 9(d) an enlarged side cross-sectional view taken along a line d—d of FIG. 9(a).

The difference between the third embodiment and the first embodiment is that in the substrate of the notched wafer 1, the first primary surface 3 has been mirror-polished, while the second primary surface 4 has not been mirror-polished. The mirror polishing is conducted after the notch 10 is chamfered, so that upon mirror polishing, the first notch chamfered portion is discriminated by measuring the first notch chamfered angle $\theta_{11}$ and accordingly, mirror polishing is conducted subsequent to the selection in advance of the first primary surface 4 on which side the first notch chamfered portion 11 is positioned.

According to the third embodiment, the obverse and reverse of the notched wafer 1 can be discriminated by visually comparing the first primary surface 3 and the second primary surface 4, because the first primary surface 3 is mirror polished while the second primary surface 4 is not.

Figure 10A:
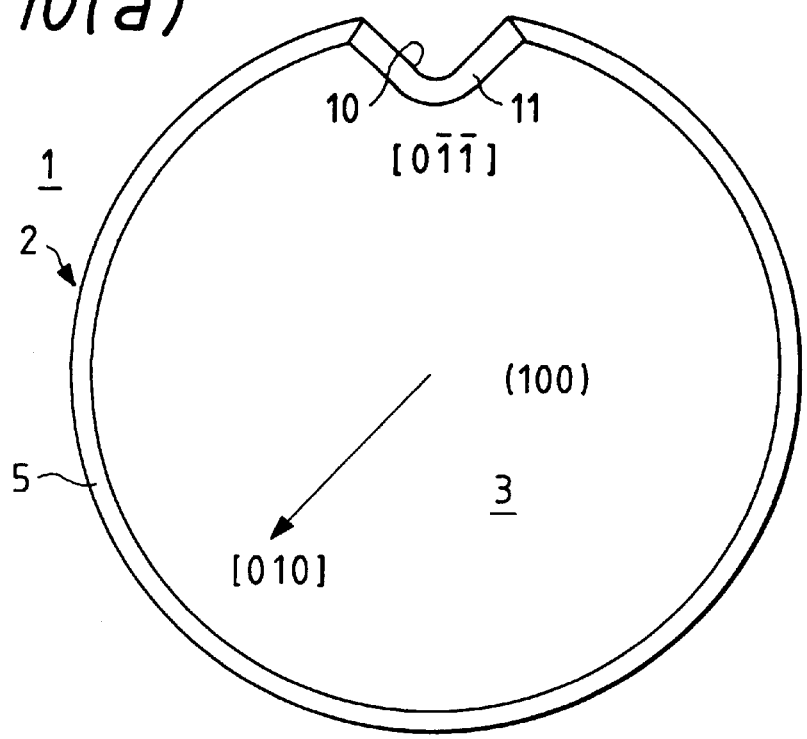
FIG. 10(a) is a plan view schematically showing a plane orientation of a crystal and FIG. 10(b) is a plain view to describe its effects.
Figure 10B:
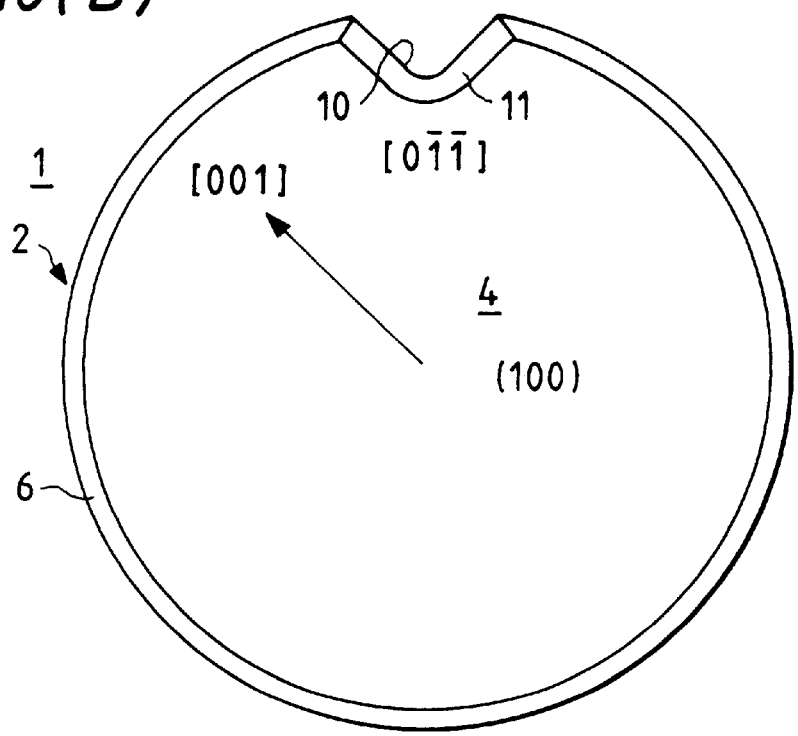

FIG. 10 illustrates a notched wafer according to the fourth embodiment of the present invention, in which FIG. 10(a) is a plan view schematically illustrating a plane orientation of a crystal and FIG. 10(b) is a plan view describing its effect.

The fourth embodiment of the present invention is different from the first embodiment in that the notch 10 is disposed in the direction of <011> relative to the substrate 2 of the silicon single crystal having a plane orientation of (100) and the wafer 1 is sliced with an inclination in the direction of <010> or <001>. In the example shown in FIG. 10(a), the wafer 1 has a substrate 2 having a plane orientation of (100), have a notch 10 disposed in the direction of [0-1-1] and is sliced with an inclination in the direction of [010]. The first chamfered portion 11 is formed at the edge portion of the notch 10 on the side of the first primary surface 3 so that the side of the first primary surface 3 becomes the obverse surface as is shown in FIG. 10(a). If the first notch chamfered portion 11 is formed wrongly on the edge portion of the notch 10 on the side of the second primary surface, the direction of [0101] becomes that of [001]. Accordingly, in the case where the wafer 1 is sliced with an inclination in the direction of <010> or <001>, it is necessary to manage the obverse and reverse correctly at the time when the substrate 2 is cut from a block and moreover, to form the first notch chamfered portion 11 and the second notch chamfered portion 12 in the notch 10 according to the obverse and reverse of the substrate 2 to be determined in the direction of the crystal.

In the process for the production of a notched wafer by slicing with an inclination in the crystal direction, as the fourth embodiment, it is desired to conduct an obverse-reverse discrimination inspection by X-ray on the substrate 2 upon the chamfering process (refer to FIG. 3) of the notch 10.

The present invention by the present inventor was described specifically based on the above embodiments. It is however noted that the present invention is not limited by to or by the above-described embodiments and can be varied within a range not departing from the scope of the invention.

For example, the first notch chamfered portion and the second chamfered portion of the notch can be formed either symmetrical or asymmetrical relative to the circumferential direction. In this case, the notch is maintained symmetrical in the circumferential direction of the plane view.

It is not necessarily set the first notch chamfered angle $\theta_{11}$ of the first notch chamfered portion formed at the inner periphery of the first primary surface of the notch at 15° and the second notch chamfered angle chamfered angle $\theta_{12}$ of the second notch chamfered portion formed at the inner periphery of the second primary surface of the notch at 25°. Here, assuming that the processing tolerance (angle) of the first notch chamfered angle $\theta_{11}$ is $K_{11}$ and the processing tolerance of the second notch chamfered angle $\theta_{12}$ is $K_{12}$, the first notch chamfered angle $\theta_{11}$ and the second notch chamfered angle $\theta_{12}$ are desired to be set to satisfy the following equation (1):

$$\theta_{12} - \theta_{11} > K_{11} + K_{12} \tag{1}$$

It is not necessarily set the first notch chamfered width $L_{11}$ of the first notch chamfered portion formed at the inner periphery of the first primary surface of the notch is set at 500 μm and the second notch chamfered angle chamfered width $L_{12}$ of the second notch chamfered portion formed at the inner periphery of the second primary surface of the notch at 300 μm. The width can be set at from 200 μm to 600 μm. From the view point of discrimination, it is desired that the difference between the first notch chamfered width and the second notch chamfered width is larger. The maximum chamfered width is determined in consideration of the decrease in the number of the wafers available from the wafer.

It is not necessarily limit the tool used for chamfering process of the first notch chamfered portion and the second notch chamfered portion to an integrated grinding tool. It is also possible to conduct chamfering using separate-type grinding tools different in the angle of the grinding plane.

In the above embodiments, the description was made with the first primary surface as the obverse. It is also possible to use the second primary surface as the obverse because which is the obverse and which is the reverse is a relative problem. In other words, IC can be fabricated on the side of the second primary surface and the side of the first primary surface can be used for handling.

Description has been made mainly of the application of the invention to MOS.IC, because the present invention is completed by the present inventor using MOS.IC, one industrial field, as a background of the invention. It is not limited to the case of MOS.IC but can also be applied to the fabrication process of other semiconductor devices such as bipolar IC, transistor, photo semiconductor device and the like.

Effects obtained by the present invention, particularly, a representative one, disclosed in this application will be briefly described as follows:

The obverse and reverse of the semiconductor wafer can be discriminated by forming the chamfered portion at the inner periphery of one primary surface and the chamfered portion at the inner periphery of the other primary surface in different shapes each other and by recognizing the difference between the both chamfered parts. By discriminating the obverse and reverse of the semiconductor wafer, the primary surface on which a semiconductor device is fabricated can always be identified so that the semiconductor device can be fabricated properly by such a semiconductor wafer.

The plane shape of the notch can be maintained symmetrical in the circumferential direction irrespective of the difference in the chamfered portions so that it is possible to prevent the drastic reduction in the rotation symmetry of the semiconductor wafer and the number of the semiconductor devices available from the wafer. It is also possible to prevent a remodeling of a notch-using positioning means in the existing manufacturing apparatus used for the fabrication process of the semiconductor device by maintaining the standards of the notch.

What is claimed is:

1. A process for the fabrication of a semiconductor integrated circuit device which comprises:
    chamfering in an obverse-reverse asymmetrical shape a notched portion of a silicon wafer that is used for the fabrication of an integrated circuit;
    providing the wafer with a substantially round plane shape, except for the notched portion, formed over a circumferential portion thereof;
    double side mirror polishing, subsequent to said chamfering step, both the obverse and reverse surfaces of said wafer; and
    distinguishing between the obverse and reverse surfaces of each of a large number of wafers in accordance with the notched portions thereof, which wafers have substantially the same shape and size; and then
    carrying out integrated circuit fabrication processes to each of the wafers, thereby forming an integrated circuit device over the obverse surface of each of the wafers; and
    chamfering the circumferential portion of the wafer, except for the notched portions, to be substantially obverse-reverse symmetrical.

2. A process for the fabrication of a semiconductor integrated circuit device according to claim 1, wherein the reverse surface of said wafer is used for handling in said polishing and carrying out steps.

3. A process for the fabrication of a semiconductor integrated circuit device according to claim 2, wherein the two dimensional shape of the notched portion of each of the wafers is substantially symmetrical with respect to an axis of symmetry passing through the center of each of the wafers.

4. A process for the fabrication of a semiconductor integrated circuit device according to claim 1, wherein the plane shape of said notched portion is substantially bilaterally symmetrical.

5. A process for the fabrication of a semiconductor integrated circuit device according to claim 2, wherein the plane shape of said notched portion is substantially bilaterally symmetrical.

6. A process for the fabrication of a semiconductor integrated circuit device according to claim 3, wherein the plane shape of said notched portion is substantially bilaterally symmetrical.

7. A silicon wafer for use in the fabrication of an integrated circuit, comprising:
    said wafer having a substantially round plane shape except for a notched portion formed in the circumferential portion of the wafer, said notched portion having a chamfered portion formed on an inner periphery of a first principal surface and a chamfered portion formed on an inner periphery of a second principal surface, and said chamfered portions being different in shape with respect to each other sufficiently to distinguish between said first and second principal surfaces,
    wherein, except for said notched portion, said wafer having a circumferential chamfered portion formed uniformly over the circumferential portion of the wafer, so that a circumferential chamfered portion formed at an outer periphery of the first principal surface and a circumferential chamfered portion formed at an outer periphery of the second principal surface are formed substantially identical in shape.

8. A silicon wafer according to claim 7, wherein both of said principal surfaces have been mirror finished.

* * * * *